US006549083B2

United States Patent
Kanazawa et al.

(10) Patent No.: US 6,549,083 B2
(45) Date of Patent: Apr. 15, 2003

(54) HIGH-FREQUENCY CRYSTAL OSCILLATOR OUTPUTTING A HARMONIC COMPONENT

(75) Inventors: Nobuyuki Kanazawa, Saitama (JP); Takeo Oita, Saitama (JP); Yuichi Sato, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 09/855,686

(22) Filed: May 16, 2001

(65) Prior Publication Data

US 2002/0017959 A1 Feb. 14, 2002

(30) Foreign Application Priority Data

Aug. 11, 2000 (JP) .......................... 2000-244682
Feb. 13, 2001 (JP) .......................... 2001-035576

(51) Int. Cl.[7] .................. H03B 5/36; H03B 29/00
(52) U.S. Cl. .................. 331/76; 331/77; 331/116 R; 331/158; 331/177 V; 331/78
(58) Field of Search .................. 331/74–77, 116 R, 331/116 FE, 158, 160, 177 R, 177 V, 78

(56) References Cited

U.S. PATENT DOCUMENTS 4,023,108 A * 5/1977 Torii .......................... 325/464
4,859,969 A    8/1989 Malinowski et al.
5,223,801 A    6/1993 Bergman
5,712,596 A * 1/1998 Van Amesfoort ............ 331/76

FOREIGN PATENT DOCUMENTS

JP           64-38813           3/1989

* cited by examiner

*Primary Examiner*—David C. Mis
(74) *Attorney, Agent, or Firm*—Oblon, Spivak, McClelland, Maier & Neustadt, P.C.

(57) ABSTRACT

A high-frequency crystal oscillator capable of outputting a signal at a frequency, for example, higher than 500 MHz without using a multiplication amplifier. The high-frequency crystal oscillator comprises a voltage controlled Colpitts oscillation circuit operating at the fundamental frequency of a quartz-crystal element, means for increasing the level of harmonic component in an output from the Colpitts oscillation circuit, an SAW (Surface Acoustic Wave) filter for selecting a component of a predetermined order of the harmonic component, and a broadband amplifier for amplifying the component selected by the SAW filter. The means for increasing the levels of harmonic component is, for example, a resistor for setting the operating point of a transistor in the oscillation circuit such that an output signal is distorted.

13 Claims, 8 Drawing Sheets

HIGH-FREQUENCY CRYSTAL OSCILLATOR OUTPUTTING A HARMONIC COMPONENT

BACKGROUND OF THE INVENTION

1. Field of the Invention

The present invention relates to an oscillator using a quartz-crystal element, and more particularly to a high-frequency crystal oscillator facilitating a reduction in size.

2. Description of the Related Art:

In recent years, an increasing need exists for oscillators which stably output signals at such a high frequency as several hundred megahertz or more in various electronic devices. For example, a certain type of digital communication network requires signals at a frequency of 622.08 MHz. Since such an application needs high frequency stability, crystal oscillators are particularly used. For high frequencies, a crystal oscillator with a lower oscillation frequency is typically used and its output is frequency-multiplied by a multiplication circuit to obtain a desired output frequency. In this case, multiplication circuits may be provided in two or three stages in series to obtain a required frequency. Voltage-controlled circuit configurations capable of changing oscillation frequencies to some degree by applied voltage are employed.

Figure 1:
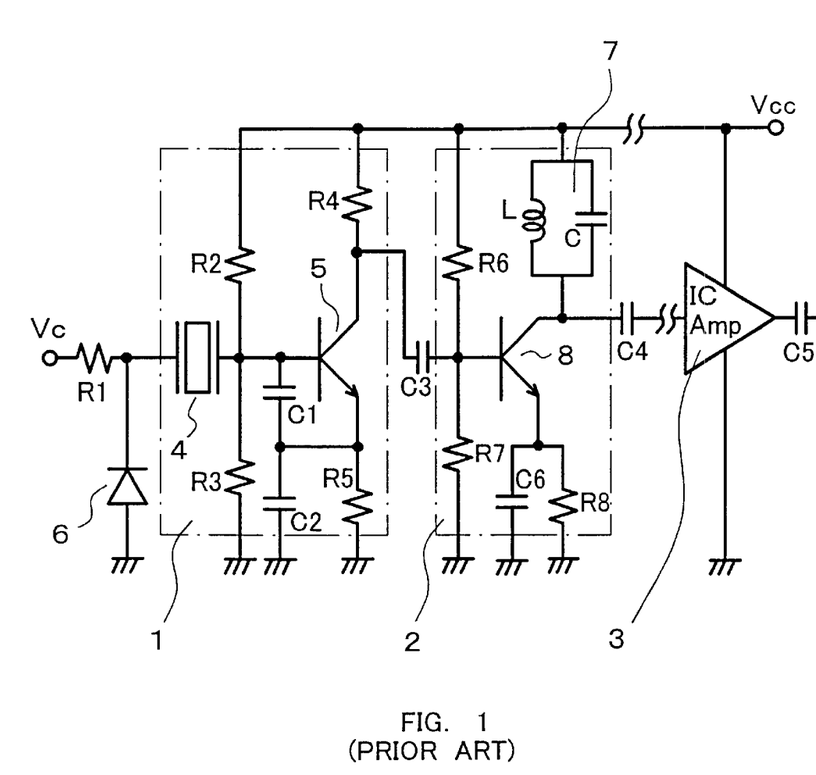
FIG. 1 is a circuit diagram showing a circuit configuration of a conventional high-frequency crystal oscillator.

FIG. 1 is a circuit diagram showing an example of a configuration of a conventional high-frequency crystal oscillator. The high-frequency oscillator generally comprises voltage-controlled crystal oscillation circuit 1, multiplication amplifier 2, and broadband amplifier 3.

Crystal oscillation circuit 1 operates quartz-crystal element 4 as an inductive element to form a resonant circuit of quartz-crystal element 4 and series capacitors C1, C2, and has transistor 5 therein. A resonance frequency signal of the resonant circuit fed back to transistor 5, and transistor 5 amplified the resonance frequency signal to oscillate crystal oscillation circuit 1. The circuit is a so-called Colpitts crystal oscillation circuit. The oscillation frequency of the circuit is slightly lower than the resonance frequency of the aforementioned resonant circuit due to a circuit capacitance other than the capacitances of series capacitors C1, C2. The oscillation frequency of crystal oscillation circuit 1 is herein referred to as an original frequency and assumed to be 155.52 MHz.

Transistor 5 has a base connected to one end of quartz-crystal element 4, an emitter connected to the midpoint (connection node) of series capacitors C1, C2 and grounded through resistor R5, and a collector connected to power source $V_{cc}$ through resistor R4. In the resonant circuit, a voltage variable capacitance element, for example variable capacitance diode (varicap diode) 6 is inserted between the other end of quartz-crystal element 4 and a ground point, thereby providing the voltage-controlled resonant circuit. Control voltage $V_c$ serving as a reverse voltage to variable capacitance diode 6 is input through resistor R1 for high frequency blocking and controls the oscillation frequency. Resistors R2, R3 are gate bias resistors for transistor 5.

Multiplication amplifier 2 is a circuit for frequency-multiplying the signal at the original frequency from crystal oscillation circuit 1. Multiplication amplifier 2 has transistor 8 with an emitter grounded and a collector connected to resonant circuit 7 comprising inductor L and capacitor C. The emitter of transistor 8 is connected to a ground point through emitter resistor R8 and bypass capacitor C6 in parallel. Resonant circuit 7 has a resonance frequency set at a value four times higher than the original frequency (155.52 MHz) to obtain an output frequency of 622.08 MHz. Transistor 8 has a base which receives as input the signal at the original frequency from crystal oscillation circuit 1 or an output signal from a multiplication amplifier in the preceding stage through coupling capacitor C3. Resistors R6, R7 are base bias resistors for transistor 8.

It should be noted that capacitor C of resonant circuit 7 is a trimmer capacitor to facilitate the adjustment of resonant circuit 7. Alternatively, inductor L may be a variable inductor. While FIG. 1 shows multiplication amplifier 2 of only one stage, multiplication amplifiers operating as Class-A amplifiers may be connected in a plurality of stages, for example three stages to gradually amplify a frequency signal while waveform distortion is reduced as well as provide amplification up to an input level to the subsequent stage.

Figure 2:
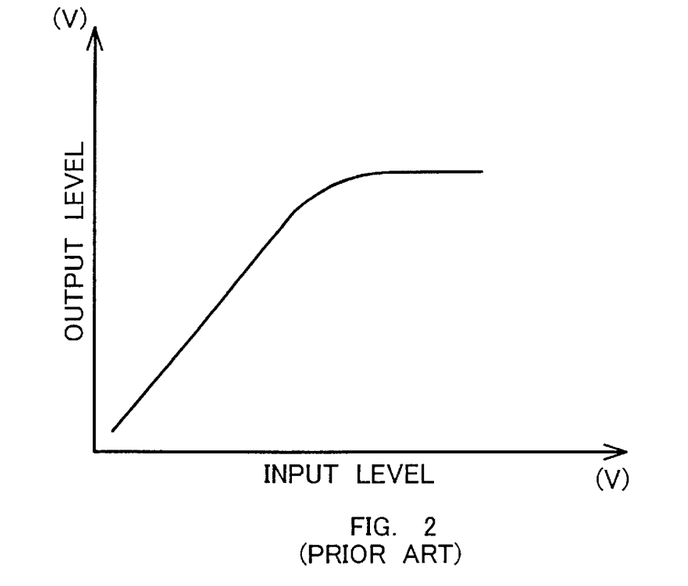
FIG. 2 is a graph showing the input/output characteristic of a linear IC amplifier.

Broadband amplifier 3, which is used as a final stage amplifier, amplifies the signal at the output frequency fed from multiplication amplifier 2 in the preceding stage through coupling capacitor C4 to a predetermined output level value with its waveform maintained, and outputs the amplified signal to an external circuit, not shown, through coupling capacitor C5. As broadband amplifier 3, a linear IC (Integrated Circuit) amplifier with a linear output level characteristic to the input level, is used. The linear IC amplifier is employed as the final stage due to its low power consumption and high amplification factor. In this example, supply voltage $V_{cc}$ is 3.3 V. FIG. 2 is a graph showing the input/output characteristic of the linear IC. The output level is in proportion to the input level until a certain input level. When the certain input level is exceeded, the output level peaks out, that is, the output level becomes substantially constant regardless of the input level.

Figure 3:
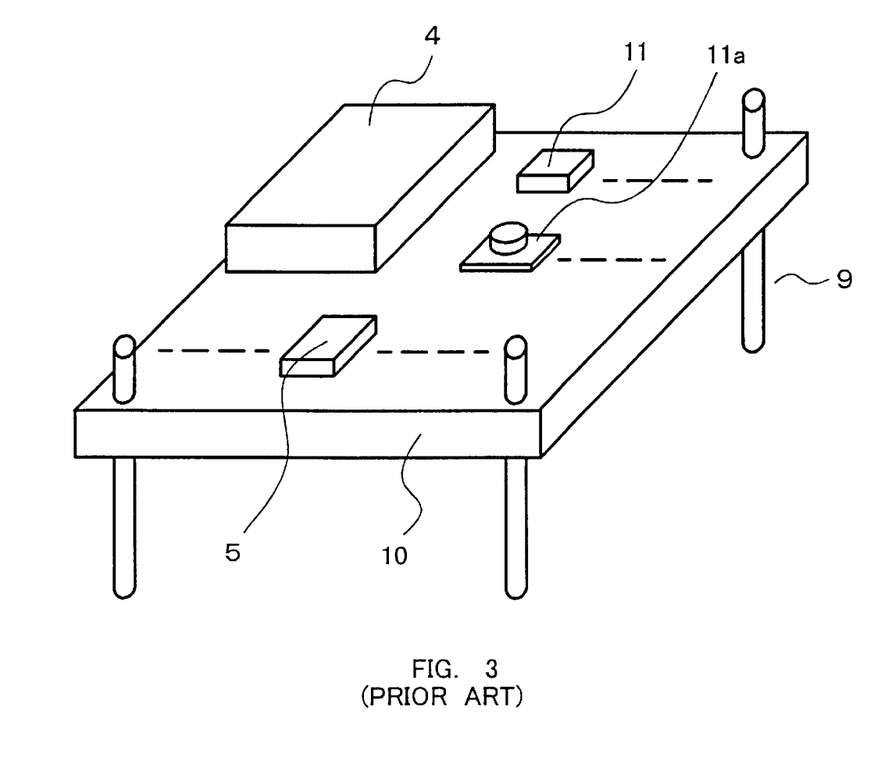
FIG. 3 is a perspective view showing a configuration of the conventional high-frequency crystal oscillator.

The aforementioned crystal oscillation circuit 1, multiplication amplifier 2, and broadband amplifier 3 are accommodated as an integral circuit in a shield container to provide the high-frequency crystal oscillator. Specifically, as shown in FIG. 3, quartz-crystal element 4, transistors 5, 8, various elements 11 including resistors, capacitors and inductors, and the linear IC amplifier which constitute crystal oscillation circuit 1, multiplication amplifier 2, and broadband amplifier 3 are mounted on circuit board 10 formed of, for example, a glass fabric base-epoxy resin laminate. A wiring pattern, not shown, is formed on the surface of circuit board 10. Terminals 9 for external connection are attached to circuit substrate 10. Circuit board 10 as described above is fixed to a metal base and covered with a metal cover to complete the high-frequency crystal oscillator accommodated in the shield container.

In the aforementioned conventional high-frequency crystal oscillator, however, the number of used elements such as transistors and passive elements is increased since the original frequency (for example 155.52 MHz) of the crystal oscillation circuit is caused to reach the predetermined output frequency (622.08 MHz) and output level by multiplication amplifiers 2 in a plurality of stages. In addition, the resonant circuit provided for each multiplication amplifier employs a trimmer capacitor or a variable inductor resulting in a larger size to present a problem of an inevitably large size of the circuit as a whole. Furthermore, adjustments required at a number of portions lead to reduced productivity. As the number of elements is increased, troubles occur more frequency to raise the possibility of impairing reliability.

A possible attempt to reduce the number of the stages of the multiplication amplifier is to operate a quartz-crystal element in a crystal oscillation circuit in an overtone mode. In the operation in the overtone mode, however, the frequency changing range when the load capacitance of the quartz-crystal element is changed is significantly narrowed as compared with a case where the quartz-crystal element oscillates at its fundamental frequency mode, and thus a required varying range of frequencies may not be achieved.

SUMMARY OF THE INVENTION

It is an object of the present invention to provide a high-frequency crystal oscillator which has a reduced number of circuit elements to promote reductions in size and weight and accomplishes high reliability.

It is another object of the present invention to provide a high-frequency crystal oscillator capable of obtaining a high oscillation output level without adjustments.

The objects of the present invention are achieved by a high-frequency crystal oscillator comprising an oscillation circuit using a quartz-crystal element, means for increasing level of harmonic component in an output from the oscillation circuit, a filter for selecting a component of a predetermined order of the harmonic component, and an amplifier for amplifying the component selected by the filter.

In the present invention, a SAW (Surface Acoustic Wave) filter is preferable as the filter. A Colpitts oscillation circuit operating at the fundamental frequency of a quartz-crystal element is preferable as the oscillation circuit, and a voltage-controlled oscillation circuit is more preferable.

In the present invention, the fundamental frequency of the quartz-crystal element is 50 MHz to 200 MHz, for example. A specific example of the fundamental frequency is 155.52 MHz. The harmonic of the predetermined order is any of harmonics of orders 2 to 8, for example, and typically, a harmonic of order 4. The output frequency of the high-frequency crystal oscillator according to the present invention is typically in the range of 200 MHz to 2 GHz, preferably in the range of 300 MHz to 1.5 GHz, and more preferably in the range of 500 MHz to 1 GHz.

According the present invention, since a high frequency can be obtained without using a multiplication amplifier, the number of circuit elements is reduced, and it is possible to achieve a reduced size, reduced weight, and enhanced reliability in the high-frequency crystal oscillator. In addition, productivity is improved due to no need of adjustments.

DESCRIPTION OF THE PREFERRED EMBODIMENTS

Figure 4:
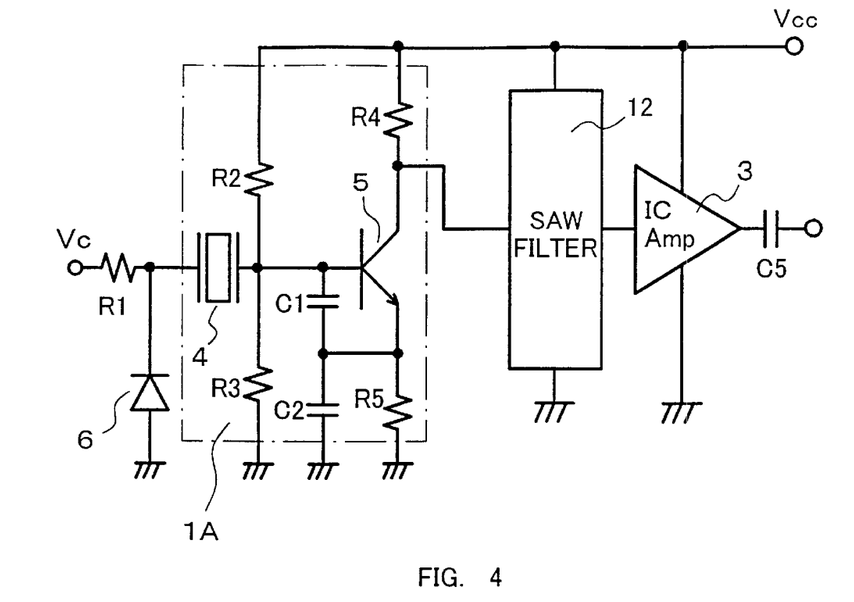
FIG. 4 is a circuit diagram showing a configuration of a high-frequency crystal oscillator according to a preferred embodiment of the present invention.

In FIG. 4 showing a high-frequency crystal oscillator according to a preferred embodiment of the present invention, the elements identical to those in FIGS. 1 to 3 are designated with the same reference numerals, and redundant description is not repeated for those elements.

The high-frequency crystal oscillator shown in FIG. 4 generally comprises crystal oscillation circuit 1A, SAW (Surface Acoustic Wave) filter 12 connected to an output from crystal oscillation circuit 1A, and broadband amplifier 3 connected to an output from SAW filter 12.

Crystal oscillation circuit 1A is a circuit similar to crystal oscillation circuit 1 in the conventional high-frequency crystal oscillator shown in FIG. 1, and is a voltage-controlled Colpitts oscillation circuit for operating quartz-crystal element 4 as an inductive element and varying its oscillation frequency by control voltage $V_c$. Quartz-crystal element 4 is operated in its fundamental frequency mode rather than in an overtone mode. Thus, the values of capacitors C1, C2 are appropriately set in accordance with the fundamental frequency of quartz-crystal element 4, as is known to the skilled in the art.

Figure 5:
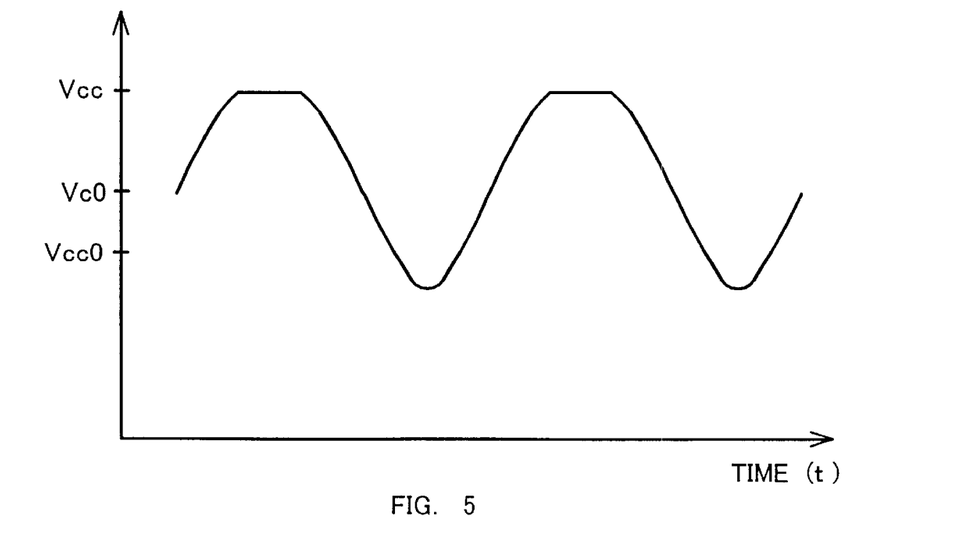
FIG. 5 is a waveform diagram illustrating an output signal from a crystal oscillation circuit in the high-frequency crystal oscillator shown in FIG. 4.

In crystal oscillation circuit 1A, the resistance ratio between base bias resistances R2, R3 of transistor 5 for oscillation and the resistance ratio between collector load resistor R4 and emitter resistance R5 are set such that center voltage $V_{c0}$ of oscillation output signal $V_O$ is higher than center voltage $V_{cc0}$ (=$V_{cc}/2$) between supply voltage $V_{cc}$ and a ground voltage. As a result, as shown in FIG. 5, in an output waveform which should be a sinusoidal wave in general, the tops in the wave are flattened to distort the waveform. With the distorted waveform, a larger amount of harmonic components is included in an output signal from crystal oscillation circuit 1A. Especially in the case of the example herein shown, the tops in the wave are flattened such that the portions of the output waveform exceeding power supply voltage $V_{cc}$ are clamped, while the bottoms in the wave are not flattened. Thus, the waveform is asymmetrical vertically and the output signal includes not only harmonics of odd-numbered orders but also a large amount of harmonics of even-numbered orders.

Figure 6:
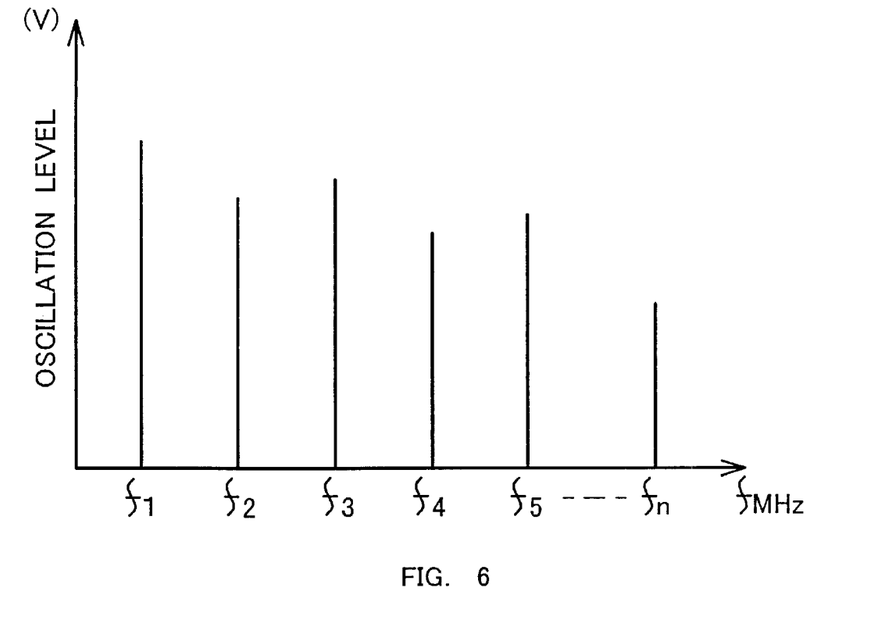
FIG. 6 is a graph showing an example of a frequency spectrum of the output signal from the crystal oscillation circuit in the high-frequency crystal oscillator shown in FIG. 4.
Figure 7:
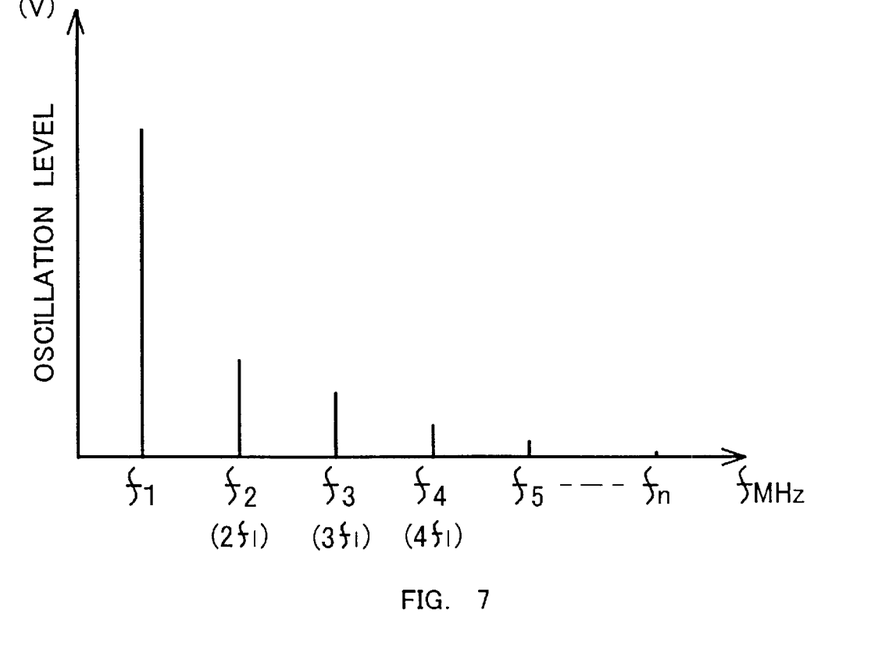
FIG. 7 is a graph showing an example of a frequency spectrum of an output signal from a crystal oscillation circuit intended for outputting a sinusoidal wave.

FIG. 6 is a graph showing an example of the frequency spectrum of an output signal from crystal oscillation circuit 1A, in which the horizontal axis represents frequencies and the vertical axis represents oscillation levels. It is assumed that the fundamental frequency of oscillation is f1, and the frequencies of second to n-th harmonic components are f2 to fn, respectively. In the example shown, the levels of the harmonic components f2 to fn to the fundamental f1 are gradually reduced as the order of the harmonic is higher, but the levels are still high sufficiently. For example, the level of the fourth harmonic f4 is 70% or higher than that of the fundamental. While the levels of the harmonics of odd-numbered orders are generally higher than the levels of the harmonics of even-numbered orders, the levels of the harmonics of the even-numbered orders are still high sufficiently. In contrast, when a circuit constant is set to output a sinusoidal wave as in the crystal oscillation circuit in the conventional high-frequency crystal oscillator, the frequency spectrum of its output signal is as shown in FIG. 7 in which the levels of harmonics f2 to fn to the level of the fundamental f1 is 10% or lower.

Such an output signal from crystal oscillation circuit 1A including a larger amount of harmonic components is fed to SAW filter 12. SAW filter 12 is configured by forming interdigital electrodes for input/output on the surface of a piezoelectric substrate, not shown, and operates as a band-pass filter for selecting only a harmonic of a particular order of the signal supplied from crystal oscillation circuit 1A and for outputting it to broadband amplifier 3 at the next stage. Broadband amplifier 3 amplifies a signal within a frequency range from, for example, 100 MHz to 2000 MHz, and comprises a linear IC amplifier described above formed of a monolithic IC.

In the high-frequency crystal oscillator herein shown, quartz-crystal element 4 is operated in the fundamental frequency mode in crystal oscillation circuit 1A to oscillate at 155.52 MHz. As a result, crystal oscillation circuit 1A outputs a signal including a large amount of harmonic components, and SAW filter 12 selects only the fourth harmonic f4 (622.08 MHz) therefrom and outputs it to broadband amplifier 3. Strictly speaking, the passband characteristic of SAW filter 12 causes output of a signal in a frequency range of f4±Δf including the fourth harmonic f4 as the center, but the level of the fourth harmonic f4 is significantly high in this frequency range. Finally, the linear input/output characteristic of broadband amplifier 3 is used to amplify the fourth harmonic f4 which serves as an oscillation output from the high-frequency crystal oscillator.

In the high-frequency crystal oscillator, since the original frequency is not frequency-multiplied but the harmonic component contained in the original frequency is used, it is not necessary to use multiplication amplifiers in a plurality of stages. The high-frequency crystal oscillator can be formed basically by a total of three components, that is, voltage-controlled crystal oscillation circuit 1A, SAW filter 12, and broadband amplifier (linear IC amplifier) 3. Thus, according to the configuration, as compared with the case of utilizing frequency multiplication, the high-frequency crystal oscillator can be greatly reduced in size since it uses no transistor or resistor constituting part of multiplication amplifiers in a plurality of stages and no capacitor or inductor in a resonant circuit in each multiplication amplifier. While the conventional high-frequency crystal oscillator has a size of approximately 20 (length)×20 (width)×10 (height) mm, the size is reduced to approximately 10×10×5 mm according to the embodiment, which corresponds to approximately ¼ in area and ⅛ in volume. In addition, the reliability of the high-frequency crystal oscillator is enhanced due to an extremely reduced number of the circuit elements. Productivity is also improved since the crystal oscillator has no portion requiring adjustments such as a tuning circuit in a multiplication amplifier.

Figure 8:
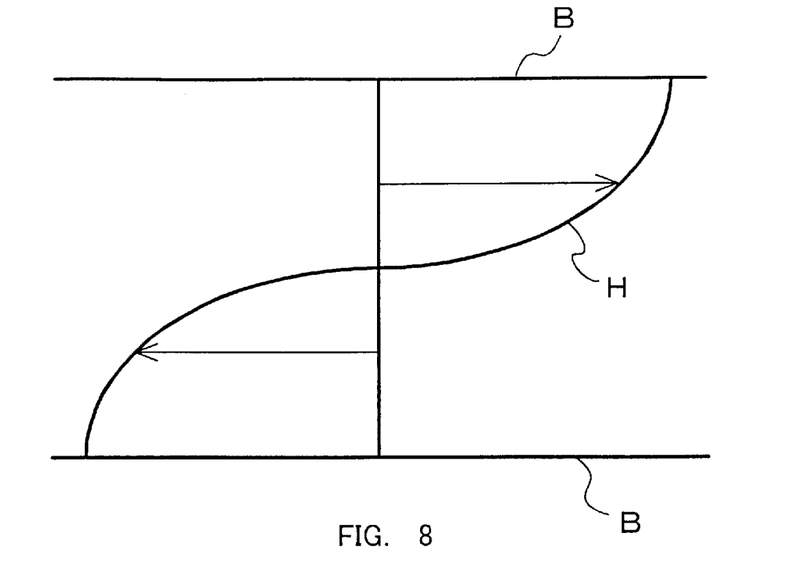
FIG. 8 is a schematic diagram for describing oscillation excursion for the fundamental of a thickness-shear quartz-crystal element.
Figure 9:
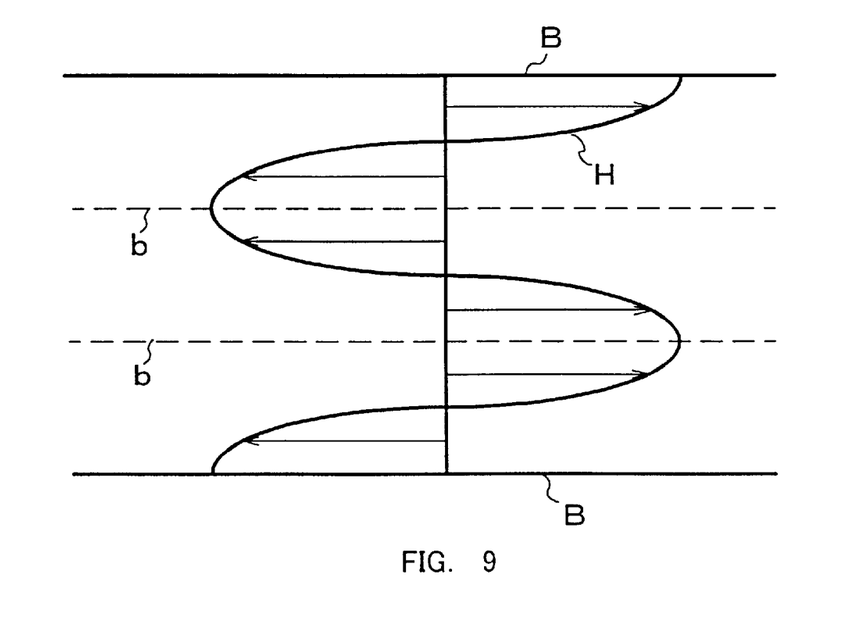
FIG. 9 is a schematic diagram for describing oscillation excursion for a harmonic of order 3 wave of a thickness-shear quartz-crystal element.

In the high-frequency crystal oscillator, quartz-crystal element 4 is operated in the fundamental mode. As quartz-crystal element 4, for example, an AT cut quartz-crystal element of thickness-shear vibration is preferably used. As well known, the resonance frequency of a thickness-shear quartz-crystal element is inversely proportional to thickness t of a quartz blank. When the quartz-crystal element is oscillated at the fundamental frequency, as shown in FIG. 8 illustrating the thickness of the quartz blank in an exaggerated manner, oscillation excursion H is at the maximum in front and back surfaces B of the quartz blank, and the directions of the excursion are opposite to each other on the front and back surfaces. In contrast, as shown in FIG. 9, oscillation excursion H for the overtone of order 3 is at the maximum in respective planes b which divide the quartz blank in the thickness direction into three in parallel to surfaces B of the quartz blank. Since the substantial thickness contributing to oscillation is reduced to ⅓ of that for the fundamental, the resonance frequency corresponds to a frequency three times higher than that of the fundamental.

Since the high-frequency crystal oscillator operates quartz-crystal element 4 in the fundamental mode, it is possible to achieve a wider frequency varying range as a voltage-controlled oscillation circuit as compared with the operation in an overtone mode.

While the high-frequency crystal oscillator of a typical embodiment of the present invention has been described, additional modified embodiments are possible in the present invention.

Figure 10:
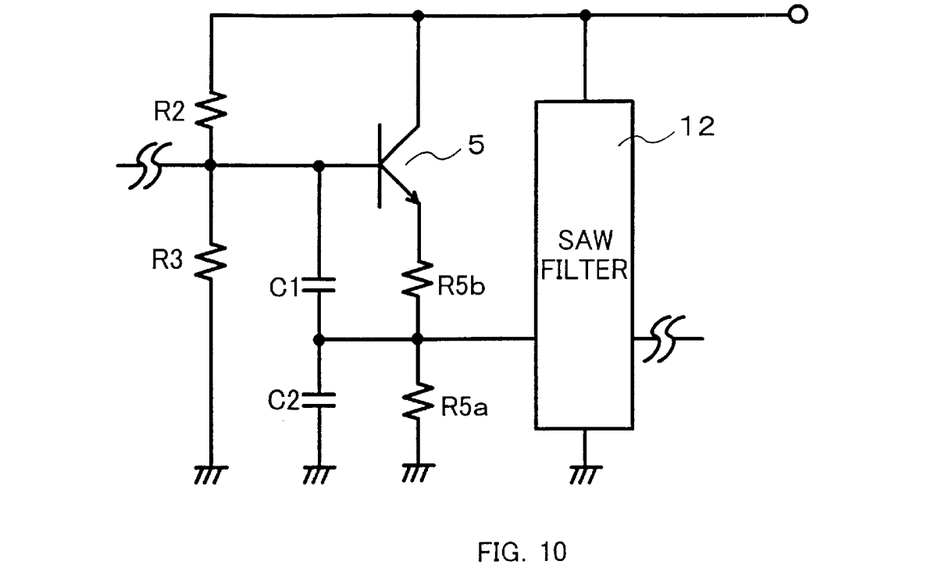
FIG. 10 is a circuit diagram showing a high-frequency crystal oscillator according to a modified embodiment.

In crystal oscillation circuit 1A, an oscillation signal may be output from the emitter side of transistor 5 rather than the collector side thereof. In this case, as shown in FIG. 10, it is possible that emitter resistors for transistor 5 are dividing resistors R5a, R5b, connecting point D of resistors R5a, R5b is connected to the midpoint of capacitors C1, C2, and a signal is output from connecting point D and supplied to SAW filter 12. No collector resistor is provided. In this case, an oscillation output can be distorted by setting the resistance ratio between resistors R2, R3 and the resistance ratio between resistors R5a, R5b.

In addition, in the circuit shown in FIG. 4 or FIG. 10, the bottoms in the sinusoidal wave may be flattened to distort the oscillation signal instead of the tops in the wave.

Since broadband amplifier 3 in the final stage has only to amplify a particular harmonic component, a narrow-band amplifier may be used instead of broadband amplifier 3.

Figure 11:
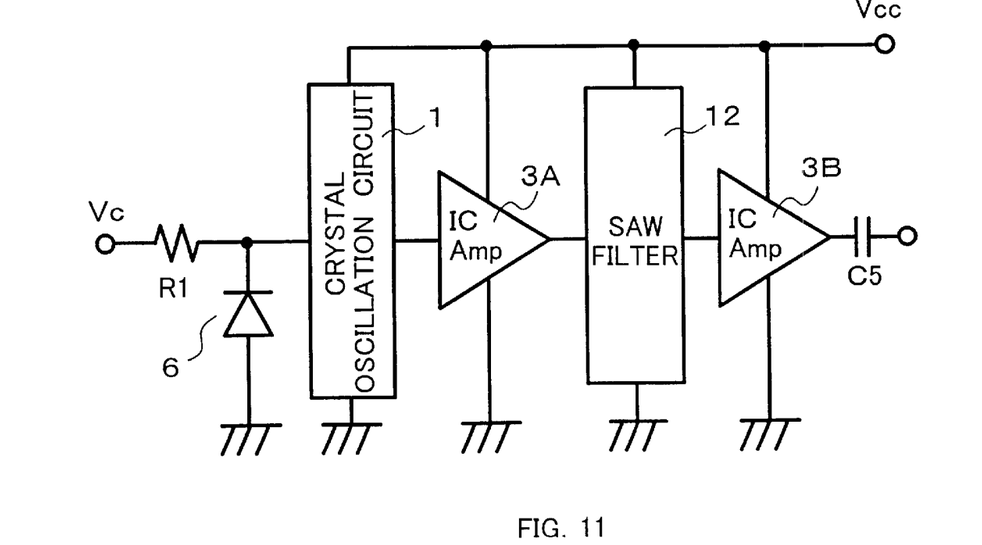
FIG. 11 is a circuit diagram showing a high-frequency crystal oscillator according to another modified embodiment.

FIG. 11 shows a high-frequency crystal oscillator according to another modified embodiment of the present invention. The operating point of transistor 5 for oscillation in crystal oscillation circuit 1A in the high-frequency crystal oscillators shown in FIGS. 4 and 10 is set such that the oscillation waveform is distorted. In the crystal oscillation circuit shown in FIG. 11, however, crystal oscillation circuit 1, set to output a sine wave similarly to the prior art, is used as a crystal oscillation circuit, and the output from crystal oscillation circuit 1 is input to broadband amplifier 3A operating in a saturation region. Since broadband amplifier 3A operates in the saturation region, the fundamental component is not amplified considerably, and harmonic components at levels lower than the fundamental component are amplified with high gain. As a result, the output from broadband amplifier 3A contains the harmonic components at high levels, and is introduced to SAW filter 12 which selects only the harmonic component of a predetermined order. The selected harmonic is amplified to a predetermined level by broadband amplifier 3B operating in a linear region.

In the high-frequency crystal oscillator, shown in FIG. 11, a multiplication amplifier is not used and a desired harmonic component is extracted by the SAW filter. Thus, it is possible to significantly reduce the number of the circuit elements to achieve a reduced size and improved reliability.

Figure 12:
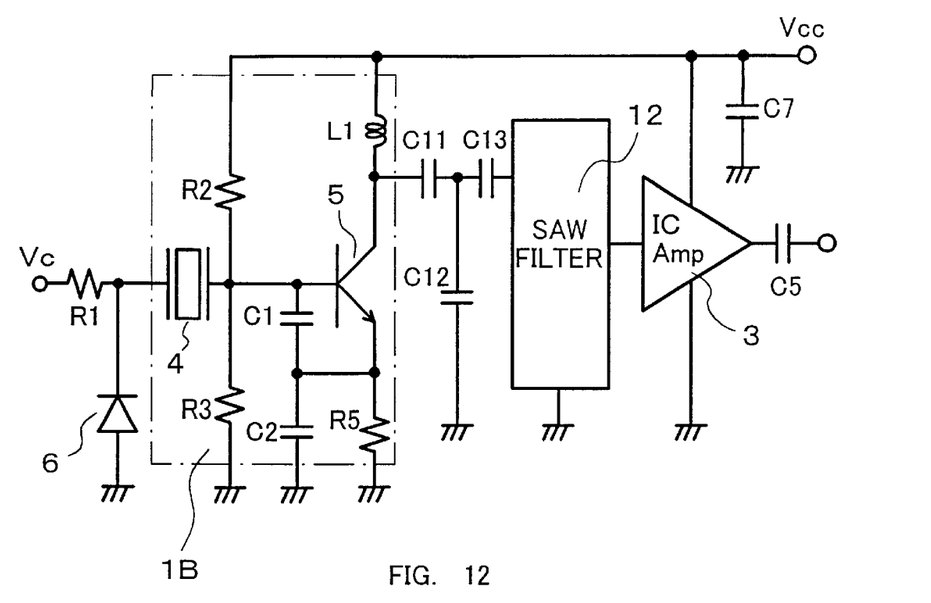
FIG. 12 is a circuit diagram showing a high-frequency crystal oscillator according to yet another modified embodiment.

In addition, an output tuning circuit may be provided on the collector side of the transistor for oscillation in the high-frequency crystal oscillator of the present invention. FIG. 12 shows an example of such a high-frequency crystal oscillator. The high-frequency crystal oscillator generally comprises crystal oscillation circuit I B, SAW filter 12, and broadband amplifier 3, similar to that shown in FIG. 4. Crystal oscillation circuit 1B is a Colpitts oscillation circuit using, for example, AT cut quartz-crystal element 4, similarly to crystal oscillation circuit 1A shown in FIG. 4, but differs from the circuit shown in FIG. 4 in that coil L with a predetermined inductance is inserted between a collector of transistor 5 and power supply $V_{cc}$ instead of a collector resistor. As later described, the operating point of transistor 5 need not be set to produce an intentionally distorted output signal, unlike the circuit shown in FIG. 4. The fundamental frequency of the crystal oscillation circuit is, for example, approximately 150 MHz, and 155.52 MHz as a specific example.

The collector of transistor 5 is connected to a ground potential through capacitors C11, C12 in series, and the series connecting point of capacitors C11, C12 is connected to an input to SAW filter 12 through capacitor C13. In this example, an LC tuning circuit is formed by the series combined capacitances of capacitors C3, C4 and coil L1, and the tuning frequency of the tuning circuit is set at the frequency of a desired order harmonic of a signal from quartz-crystal element 4. The tuning frequency is set at, for example, the frequency of the fourth harmonic, that is, approximately 600 MHz, assuming that the fundamental frequency of quartz-crystal element 4 is approximately 150 MHz. Also, capacitor C13 provides a C tap for matching the output impedance from the series connecting point of capacitors C11, C12 to the input impedance of SAW filter 12 in the next stage in accordance with the capacitance ratio between capacitors C11, C12. Capacitor C7 provided between power supply $V_{cc}$ and a ground point is a bypass capacitor for removing noise or ripple and does not contribute to the tuning frequency of the aforementioned LC tuning circuit.

While the LC tuning circuit itself is tuned to a harmonic, a circuit constant is set to produce the fundamental as a Colpitts oscillation circuit. Specifically, quartz-crystal element 4 is operated to provide the fundamental by using capacitors C1, C2 with appropriate capacitance values, particularly elements with larger capacitance values than those in an overtone mode for the equivalent inductance component of quartz-crystal element 4.

SAW filter 12 has a filter characteristic to pass only a predetermined harmonic component of the oscillation output from crystal oscillation circuit 1B, for example the harmonic component of order 4 at approximately 600 MHz, similarly to the circuit shown in FIG. 4 or FIG. 10. For example, it passes only the frequency component at 622.08 MHz. The signal passed through SAW filter 12 is amplified to a predetermined output level by broadband amplifier 3, and output through coupling capacitor C6.

In the circuit shown in FIG. 12, a stable oscillation signal at a frequency higher than 500 MHz can be obtained by Colpitts crystal oscillation circuit 1B, SAW filter 12 selectively acquiring an intended harmonic from the oscillation output from crystal oscillation circuit 1B and having a characteristic corresponding to the frequency of the harmonic, and amplifier 3 for amplifying the output from SAW filter 12. Since the circuit is provided with the output tuning circuit for tuning to a harmonic of a desired order, the operating point of transistor 5 in crystal oscillation circuit 1B need not be set to distort a signal intentionally, and an operating point as in a normal oscillation circuit for outputting a sinusoidal wave is set.

In an overtone oscillation circuit or a multiplication amplifier, since the operation condition of a transistor is changed in accordance with the tuning frequency of an output tuning circuit, fine adjustments are required in the output tuning circuit. The aforementioned crystal oscillation circuit 1B, however, is a Colpitts fundamental oscillation circuit with no need of adjustments as an oscillation circuit in which the output LC tuning circuit does not affect the operation of oscillation. Thus, it can be provided as an LC tuning circuit with no need of adjustments by selecting an appropriate circuit constant if the tuning frequency is approximately 600 MHz.

In a high-performance filter such as the SAW filter, it is preferable to reliably match the impedances between input and output for obtaining a desired filter characteristic. According to the aforementioned circuit, since the impedance matching can be performed by the C tap, reliable matching can be performed for a low input impedance of approximately 50 Ω and individual adjustments for each element are not required.

Since the oscillation circuit itself shown in FIG. 12 is operated at the fundamental frequency, a sufficient frequency varying range can be obtained. In addition, it operates with almost no adjustments, is suitable for mass production due to easy assembly, and enables reductions in size and cost.

Figure 13:
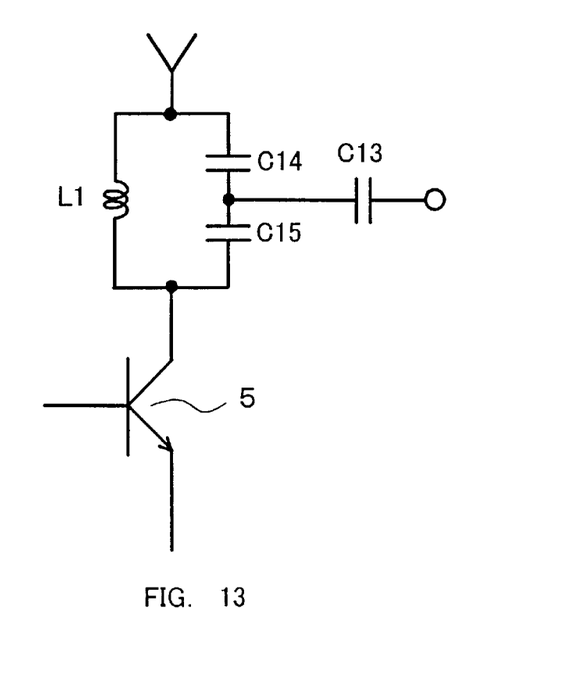
FIG. 13 is a circuit diagram showing another example of an output tuning circuit.

The configuration of the output tuning circuit is not limited to that shown in FIG. 12. For example, as shown in FIG. 13, coil L1 is inserted between a collector of transistor 5 and power supply $V_{cc}$ and capacitors C14, C15 are inserted in series to form a tuning circuit. From the series connecting point of capacitors C14, C15, an oscillation output is provided to SAW device 12 through capacitor C13.

Figure 14:
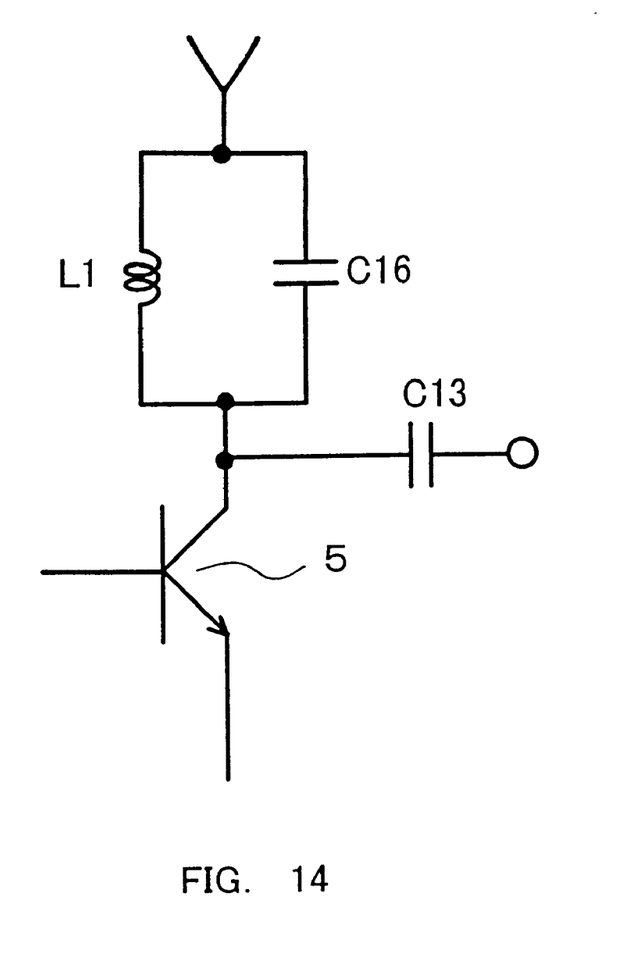
FIG. 14 is a circuit diagram showing yet another example of the output tuning circuit.

Alternatively, as shown in FIG. 14, an output tuning circuit is formed of a parallel resonant circuit comprising coil L1 and capacitor C16, and an oscillation output is supplied to SAW device 12 from a collector of transistor 5 through capacitor C13.

While several preferred embodiments of the high-frequency crystal oscillator of the present invention have been described for the case of a voltage-controlled oscillation circuit, it goes without saying that the present invention is applicable to a normal crystal oscillation circuit not of a voltage-controlled type.

What is claimed is:
1. A high-frequency crystal oscillator comprising:
   a Colpitts oscillation circuit including a quartz-crystal element and a transistor, and operating at a fundamental frequency of said quartz-crystal element;
   means for increasing a level of a harmonic component in an output of said Colpitts oscillation circuit, said increasing means including a resistor for setting an operating point of said transistor so that one of tops and bottoms of an output waveform of said transistor are flattened;
   a Surface Acoustic Wave (SAW) filter for selecting a component of a predetermined order of said harmonic component; and an amplifier for amplifying said harmonic component selected by said filter.

2. The high-frequency crystal oscillator according to claim 1, wherein said quartz-crystal element is an AT cut quartz-crystal element.

3. The high-frequency crystal oscillator according to claim 1, further comprising a voltage variable capacitance element for providing a variable oscillation frequency of said Colpitts oscillation circuit.

4. The high-frequency crystal oscillator according to claim 3, wherein said voltage variable capacitance element is a variable capacitance diode.

5. The high-frequency crystal oscillator according to claim 1, wherein said SAW filter selects a harmonic of order 4.

6. The high-frequency crystal oscillator according to claim 5, wherein the frequency of said harmonic of order 4 is 622.08 MHz.

7. A high-frequency crystal oscillator comprising:
a Colpitts oscillation circuit including a quartz-crystal element and a transistor, and operating at a fundamental frequency of said quartz-crystal element;
means for increasing a level of a harmonic component in an output of said Colpitts oscillation circuit, said increasing means comprising an output tuning circuit connected to said transistor and tuned to a predetermined order of said harmonic component;
a Surface Acoustic Wave (SAW) filter for selecting the predetermined order of said harmonic component; and
an amplifier for amplifying said harmonic component selected by said filter.

8. The high-frequency crystal oscillator according to claim 7, wherein said quartz-crystal element is an AT cut quartz-crystal element.

9. The high-frequency crystal oscillator according to claim 7, further comprising a voltage variable capacitance element for providing a variable oscillation frequency of said Colpitts oscillation circuit.

10. The high-frequency crystal oscillator according to claim 9, wherein said voltage variable capacitance element is a variable capacitance diode.

11. The high-frequency crystal oscillator according to claim 7, wherein said output tuning circuit is an LC tuning circuit connected to collector of said transistor and having a C tap, and said SAW filter is supplied from said C tap with an oscillation output matched to an input impedance of said SAW filter.

12. The high-frequency crystal oscillator according to claim 11, wherein said SAW filter selects a harmonic of order 4.

13. The high-frequency crystal oscillator according to claim 12, wherein the frequency of said harmonic of order 4 is 622.08 MHz.

* * * * *